United States Patent
Böck et al.

(10) Patent No.: US 6,635,545 B2
(45) Date of Patent: Oct. 21, 2003

(54) METHOD FOR FABRICATING A BIPOLAR TRANSISTOR AND METHOD FOR FABRICATING AN INTEGRATED CIRCUIT CONFIGURATION HAVING SUCH A BIPOLAR TRANSISTOR

(75) Inventors: Josef Böck, München (DE); Wolfgang Klein, Zorneding (DE); Herbert Schäfer, Höhenkirchen-Siegertsbrunn (DE); Martin Franosch, München (DE); Thomas Meister, Taufkirchen (DE); Reinhard Stengl, Stadtbergen (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/160,630

(22) Filed: Jun. 3, 2002

(65) Prior Publication Data

US 2002/0168829 A1 Nov. 14, 2002

Related U.S. Application Data

(63) Continuation of application No. PCT/EP00/12112, filed on Dec. 1, 2000.

(30) Foreign Application Priority Data

Dec. 2, 1999 (DE) .......................... 199 58 062

(51) Int. Cl.[7] ............................. H01L 21/331
(52) U.S. Cl. ..................... 438/348; 257/572
(58) Field of Search ................ 438/340–350, 438/365–367, 682, 309–327, 337; 257/572, 576, 592

(56) References Cited

U.S. PATENT DOCUMENTS

| | | | | |
|---|---|---|---|---|
| 5,232,861 A | * | 8/1993 | Miwa | 437/31 |
| 5,321,301 A | * | 6/1994 | Sato et al. | 257/592 |
| 5,324,983 A | | 6/1994 | Onai et al. | |
| 5,498,567 A | | 3/1996 | Klose et al. | |
| 5,861,640 A | * | 1/1999 | Gomi | 257/197 |
| 6,048,773 A | * | 4/2000 | Jeon | 438/350 |

FOREIGN PATENT DOCUMENTS

| | | |
|---|---|---|
| EP | 0 535 350 B1 | 4/1993 |
| EP | 0 535 350 A2 | 4/1993 |

* cited by examiner

*Primary Examiner*—Matthew Smith
*Assistant Examiner*—Lee Calvin
(74) *Attorney, Agent, or Firm*—Laurence A. Greenberg; Werner H. Stemer; Ralph E. Locher

(57) ABSTRACT

The bipolar transistor is produced such that a connection region of its base is provided with a silicide layer, so that a base resistance of the bipolar transistor is small. No silicide layer is produced between an emitter and an emitter contact and between a connection region of a collector and a collector contact. The base is produced by in situ-doped epitaxy in a region in which a first insulating layer is removed by isotropic etching such that the connection region of the base which is arranged on the first insulating layer is undercut. In order to avoid defects of a substrate in which the bipolar transistor is partly produced, isotropic etching is used for the patterning of auxiliary layers, whereby etching is selective with respect to auxiliary layers lying above, which are patterned by anisotropic etching.

10 Claims, 8 Drawing Sheets

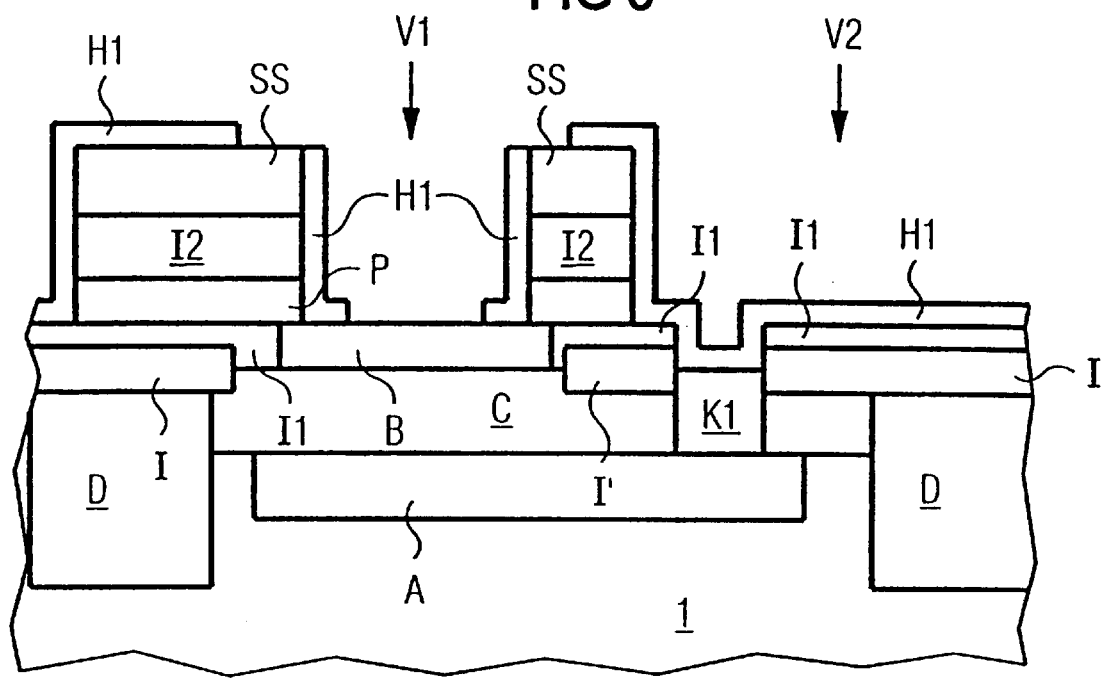
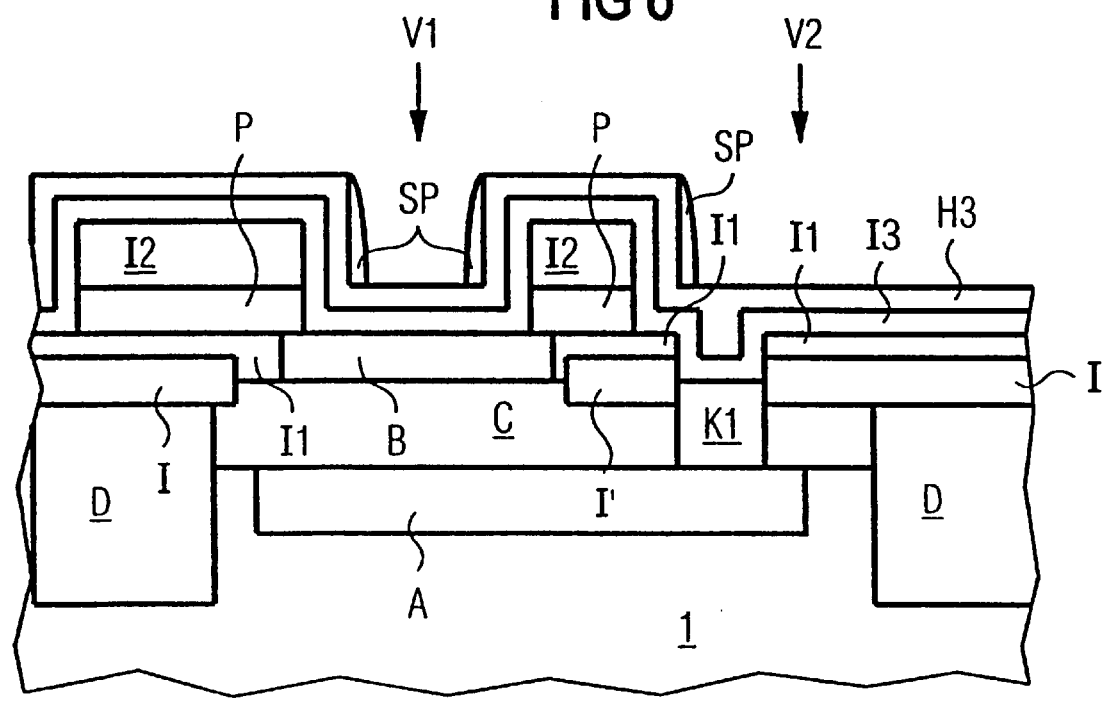

METHOD FOR FABRICATING A BIPOLAR TRANSISTOR AND METHOD FOR FABRICATING AN INTEGRATED CIRCUIT CONFIGURATION HAVING SUCH A BIPOLAR TRANSISTOR

CROSS-REFERENCE TO RELATED APPLICATION

This application is a continuation of copending International Application No. PCT/EP00/12112, filed Dec. 1, 2000, which designated the United States and was not published in English.

BACKGROUND OF THE INVENTION

Field of the Invention

The invention relates to a method for fabricating a bipolar transistor.

Such a method is disclosed, for example, in the commonly assigned U.S. Pat. No. 5,498,567 and in the corresponding European patent EP 0 535 350 B1). A highly n-doped connection region of a collector is produced on a p-doped substrate made of silicon. The lightly n-doped collector made of silicon is applied above the terminating region of the collector. An insulating structure is produced in the substrate, which structure comprises trenches filled with insulation material and channel stop regions which are arranged below said trenches and are highly p-doped. The insulating structure surrounds the bipolar transistor to be produced laterally within the substrate. There are produced on the substrate a first $SiO_2$ layer, above that a polysilicon layer, above that a second $SiO_2$ layer and above that a layer made of silicon nitride. Afterward, by masked etching, a first depression reaching as far as the first insulating layer is produced, and a second depression reaching as far as the connection region of the collector is produced. In order to produce an auxiliary layer, silicon nitride is deposited and etched back, so that lateral areas of the first depression and of the second depression remain covered by the auxiliary layer and bottoms of the depressions are uncovered. Afterward, $SiO_2$ is etched isotropically, so that a part of the first $SiO_2$ layer is removed. In this case, the collector is uncovered below the first depression. By means of selective epitaxy, the removed part of the first $SiO_2$ layer is replaced by a p-doped base. Afterward, a third $SiO_2$ layer and a second polysilicon layer are deposited. The second polysilicon layer is etched back anisotropically selectively with respect to the third $SiO_2$ layer, thereby producing spacers. Afterward, uncovered parts of the third $SiO_2$ layer are removed by isotropic etching selectively with respect to the spacers. Afterward, a third polysilicon layer is deposited and etched back, so that an emitter is produced in the first depression and a contact to the collector is produced in the second depression. A third depression reaching as far as the first layer made of polysilicon is produced with the aid of masked etching. Afterward, conductive material is deposited and planarized, so that a contact to the emitter is produced in the first depression, a further contact to the collector is produced in the second depression and a contact to the base is produced in the third depression.

The so-called base resistance, which is the resistance between the base and a line which is connected to the base via the contact to the base, determines, besides the transition frequency and the base-collector capacitance, important characteristic quantities of the bipolar transistor, such as its maximum oscillation frequency, its gain, its minimum noise figure, its gate delay times, etc. The base resistance is preferably small.

Resistances formed between the emitter and a line connected thereto ("external emitter resistance") and between the collector and a line connected thereto ("external collector resistance") are readily used in integrated circuit configurations to realize ohmic load resistances. Thus, these resistances should not be too small.

It is known to reduce a boundary resistance between polysilicon and a metal by siliconizing the polysilicon, i.e. providing it with a silicide layer.

SUMMARY OF THE INVENTION

It is accordingly an object of the invention to provide a method of fabricating a bipolar transistor and a method of fabricating an integrated circuit configuration having at least one bipolar transistor of the novel type, which overcomes the above-mentioned disadvantages of the heretofore-known devices and methods of this general type and which provides for a bipolar transistor in which the base resistance is lower than the external emitter resistance and to an integrated circuit configuration having such a bipolar transistor.

With the foregoing and other objects in view there is provided, in accordance with the invention, a method of fabricating a bipolar transistor, which comprises:

producing a collector doped by a first conductivity type in a substrate of semiconductor material;

producing a first insulating layer covering the collector on the substrate;

producing a polysilicon layer doped by a second conductivity type, opposite the first conductivity type, on the first insulating layer;

producing a second insulating layer on the polysilicon layer;

forming a first depression above the collector, cutting through the second insulating layer and the polysilicon layer;

subsequently producing a first auxiliary layer and a second auxiliary layer above the first auxiliary layer, and forming the first and second auxiliary layers so thin as not to fill the first depression;

anisotropically etching the second auxiliary layer until the first auxiliary layer is uncovered;

isotropically etching the first auxiliary layer selectively with respect to the second auxiliary layer until a part of the first insulating layer is uncovered;

removing a part of the first insulating layer by isotropic etching selectively with respect to the first auxiliary layer, thereby uncovering parts of the polysilicon layer and parts of the collector;

replacing the removed part of the first insulating layer with a base by selective epitaxy of silicon in situ-doped by the second conductivity type;

subsequent to producing the base, producing a third auxiliary layer;

producing spacers in the first depression on the third auxiliary layer, by deposition and etching-back of material;

isotropically etching the third auxiliary layer selectively with respect to the spacers, and uncovering the base;

depositing polysilicon doped by the first conductivity type and, thereabove, an isolating layer, and jointly patterning to produce an emitter covered by the isolating layer, partly arranged in the first depression, adjoining the base, and partly overlapping the second insulating layer;

anisotropically etching the second insulating layer selectively with respect to the isolating layer until the polysilicon layer is uncovered;

producing a silicide layer on the polysilicon layer but not on the isolating layer;

producing a base contact on the silicide layer; and subsequent to producing the silicide layer, at least partly removing the isolating layer, and producing an emitter contact on the emitter.

In other words, the object is achieved by means of a method for fabricating a bipolar transistor in which a collector doped by a first conductivity type is produced in a substrate made of semiconductor material. A first insulating layer covering the collector is produced on the substrate. A layer made of polysilicon doped by a second conductivity type, opposite to the first conductivity type, is produced on the first insulating layer. A second insulating layer is produced on the layer made of polysilicon. A first depression is produced, which cuts through the second insulating layer and the layer made of polysilicon and is arranged above the collector. After the production of the first depression, a first auxiliary layer and, above the latter, a second auxiliary layer are produced, which are so thin that they do not fill the first depression. The second auxiliary layer is etched anisotropically until the first auxiliary layer is uncovered. The first auxiliary layer is etched isotropically selectively with respect to the second auxiliary layer until a part of the first insulating layer is uncovered. A part of the first insulating layer is removed by isotropic etching selectively with respect to the first auxiliary layer, so that parts of the layer made of polysilicon and parts of the collector are uncovered. By means of selective epitaxy of silicon in situ-doped by the second conductivity type, the removed part of the first insulating layer is replaced by a base. A third auxiliary layer is produced after the production of the base. On the first auxiliary layer, spacers are produced in the first depression by deposition and etching-back of material. The third auxiliary layer is etched isotropically selectively with respect to the spacers. The base is subsequently uncovered. Polysilicon doped by the first conductivity type and, above that, an isolating layer are deposited and jointly patterned to produce an emitter which is covered by the isolating layer, is partly arranged in the first depression, adjoins the base and partly overlaps the second insulating layer. The second insulating layer is etched anisotropically selectively with respect to the isolating layer until the layer made of polysilicon is uncovered. A silicide layer is produced on the layer made of polysilicon but not on the isolating layer. A contact of the base is produced on the silicide layer. After the production of the silicide layer, the isolating layer is at least partly removed, and a contact of the emitter is produced on the emitter.

Furthermore, the above objects are achieved by method of fabricating an integrated circuit configuration with at least one bipolar transistor produced according to the above-outlined process. The method comprises:

removing a further part of the first insulating layer during the masked etching of the first insulating layer for the purpose of uncovering the first collector contact;

by producing the polysilicon layer, replacing the removed further part of the first insulating layer by at least one part of an emitter of a further bipolar transistor whose conductivity type is opposite to the conductivity type of the bipolar transistor.

The base adjoins the layer made of polysilicon. The silicide layer is arranged between the layer made of polysilicon and the contact to the base. Consequently, the base resistance is smaller compared with a bipolar transistor without a silicide layer.

The polysilicon layer is undercut by virtue of the isotropic etching of the first insulating layer. The undercutting contributes to the overlap between the base and the collector. Since the undercutting can be precisely controlled, the overlap can be small, so that a capacitance formed by the base and the collector can be very small.

On account of the isolating layer, no silicide is formed at horizontal areas of the emitter. Since the contact to the emitter is produced on the emitter, i.e. on a horizontal area of the emitter, no silicide is arranged between the contact to the emitter and the emitter. Consequently, the resistance which is formed by the emitter and by the contact to the emitter and forms at least part of the external emitter resistance is greater than the base resistance.

A silicide can be formed at lateral, uncovered parts of the emitter. However, this does not constitute a disadvantage since the contact to the emitter does not adjoin the lateral parts of the emitter.

A horizontal cross section of the emitter is greater than a horizontal cross section of the-first depression, so that the emitter partly overlaps the second insulating layer. Consequently, a mask with a larger opening than the first depression is used for producing the emitter by patterning of the polysilicon and of the isolating layer. This is advantageous since a misalignment of the mask with regard to the first depression does not have the consequence that a horizontal area of the emitter is formed within the first depression. A silicide would be formed on such a horizontal area since it is not covered by the isolating layer, so that the contact to the emitter would adjoin silicide, which would result in a lower external emitter resistance.

The second auxiliary layer serves for enabling the patterning of the first auxiliary layer by isotropic etching. Isotropic etching is advantageous relative to anisotropic etching since the first auxiliary layer is not bombarded with ions which could pass through the first insulating layer into the substrate and could cause defects there.

The patterning of the second auxiliary layer by anisotropic etching is less critical since the ions used in this case would also have to get through the first auxiliary layer in addition to the first insulating layer in order to reach the substrate. Consequently, fewer defects are produced during the anisotropic etching of the second auxiliary layer than during patterning of the first auxiliary layer by anisotropic etching.

The same applies analogously to the third auxiliary layer and to the spacers. In this case, the first auxiliary layer corresponds to the third auxiliary layer and the second auxiliary layer corresponds to the spacers.

In order to obtain an external collector resistance which is greater than the base resistance, it is advantageous to provide the following method steps:

Before the production of the first insulating layer, a connection region of the collector is formed in the form of a buried layer which is doped by the first conductivity type, is arranged below the collector and has a higher dopant concentration than the collector. Before the production of the first insulating layer, there is produced in the substrate a first contact of the collector, which reaches as far as the connection region of the collector.

The first insulating layer is produced in such a way that it covers the first contact of the collector. After the production of the second insulating layer and before the production of the first auxiliary layer, a second depression is produced, which, in the region of the first contact of the collector, reaches as far as the first contact of the collector and, outside the region of the first contact of the collector, reaches as far as the first insulating layer and is arranged beside the first depression.

During the anisotropic etching of the second auxiliary layer, a protective mask covers the second depression. During the production of the emitter, the polysilicon and the isolating layer are patterned to produce a second contact of the collector, which is covered by the isolating layer, is arranged in the second depression and on the first contact of the collector and partly overlaps the first insulating layer. After the production of the silicide layer on the layer made of polysilicon, the isolating layer on the second contact of the collector is at least partly removed. Afterward, a third contact of the collector is produced on the second contact of the collector.

Since horizontal areas of the second contact of the collector are covered by the isolating layer, no silicide can be formed thereon. Consequently, the third contact is produced directly on the second contact of the collector, so that the external collector resistance is large compared with a bipolar transistor in which a silicide is arranged between the second contact and the third contact of the collector.

Since the second contact of the collector overlaps the first insulating layer, a horizontal cross section of the second contact of the collector is greater than a horizontal cross section of that part of the second depression which reaches as far as the first contact of the collector. Consequently, during the patterning of the polysilicon and of the isolating layer for the purpose of producing the second contact of the collector, even in the event of misalignment of a mask used in the process, it is possible to prevent a horizontal area of the second contact of the collector from being formed within the part of the second depression. A silicide would be formed on such a horizontal area since it is not covered by the isolating layer, so that the third contact of the collector would adjoin silicide, which would result in a lower external collector resistance.

The protective mask can be removed after the anisotropic etching of the second auxiliary layer and before the production of the base. On account of the protective mask, the second auxiliary layer above the second depression is not removed-during the anisotropic etching of the second auxiliary layer, so that the first contact of the collector remains protected during the production of the base.

As an alternative, no protective mask is used during the anisotropic etching of the second auxiliary layer. In exchange, a mask covering the first contact of the collector is used during the production of the base.

The first depression and the second depression can be produced simultaneously or successively.

That part of the second depression which reaches as far as the first contact of the collector can be produced by masked etching after the production of the remaining part of the second depression. Thus, in order to produce the second depression, etching is effected firstly as far as the first insulating layer with a first mask, and subsequently with a second mask as far as the first contact of the collector.

As an alternative, the second depression can be produced for example as follows:

After the production of the first insulating layer and before the production of the layer made of polysilicon, the first contact of the collector is uncovered by means of masked etching. Afterward, the layer made of polysilicon is produced, so that it adjoins the first contact of the collector. The second depression can then be produced in one step, since the layer made of polysilicon directly adjoins the first contact of the collector in the region of the first contact of the collector but adjoins the first insulating layer outside the region of the first contact of the collector.

The first insulating layer, the second insulating layer and the second auxiliary layer are preferably produced from $SiO_2$. The first auxiliary layer is preferably produced from silicon nitride. In this case, it is advantageous to produce a protective layer made of silicon nitride on the second insulating layer. The first depression and the second depression are produced after the production of the protective layer. The protective layer is preferably removed during the removal of the first auxiliary layer.

The protective layer is attacked during the removal of the first auxiliary layer since both the protective layer and the first auxiliary layer are composed of silicon nitride and the first auxiliary layer is removed by isotropic etching.

During the anisotropic etching of the second auxiliary layer, generally the protective layer is partly uncovered. This is the case in particular when no protective mask is used in the process. However, even when using the protective mask which covers the second depression, for example, an opening of the protective mask is preferably chosen to be so large that, in the event of misalignment of the protective mask with regard to the first depression, the first depression is nevertheless uncovered. The protective layer protects, instead of the first auxiliary layer, parts of the second insulating layer during the isotropic etching of the first insulating layer.

It is also possible to use other materials for the various layers.

Preferably, after the production of the base and before the production of the third auxiliary layer, a third insulating layer is produced from $SiO_2$, and is so thin that the first depression is not filled by the third insulating layer and by the third auxiliary layer. The third auxiliary layer is preferably produced from silicon nitride. The spacers are preferably produced from polysilicon since polysilicon can be dry-etched with very great selectivity with respect to silicon nitride. The third auxiliary layer is etched isotropically selectively with respect to the spacers until the third insulating layer is uncovered. Afterward, the third insulating layer is etched isotropically selectively with respect to the third auxiliary layer until the base is uncovered.

After the production of the silicide layer, it is possible to produce an intermediate oxide in which there are produced a first contact hole, which reaches as far as the silicide layer, a second contact hole, which reaches as far as the emitter, and a third contact hole, which reaches as far as the second contact of the collector. The contact of the base is produced in the first contact hole. The contact of the emitter is produced in the second contact hole. The third contact of the collector is produced in the third contact.

The isolating layer acts as an etching stop during the production of the contact holes of different depths in the intermediate oxide, so that the contact holes can be produced simultaneously without the emitter being abraded. Uncovered parts of the isolating layer are removed after the production of the contact holes.

The substrate is composed, for example, of silicon (Si), germanium (Ge), or SiGe.

In order to avoid scattered light during the exposure of photoresist for the purpose of producing a photoresist mask used to produce the first depression and/or the second depression, it is advantageous to deposit a layer made of amorphous silicon before the production of the photoresist mask. The layer made of amorphous silicon is removed during the etching of the layer made of polysilicon selectively with respect to silicon nitride for the purpose of producing the first depression.

Preferably, before the production of the first insulating layer, an insulating structure is produced in the substrate, which structure laterally surrounds that part of the bipolar transistor to be produced which is arranged in the substrate. If the bipolar transistor is part of an integrated circuit configuration, then the insulating structure insulates the bipolar transistor from other semiconductor components of the integrated circuit configuration which are arranged in the substrate.

The insulating structure may comprise insulation trenches filled with insulating material, or an insulation, produced by thermal oxidation, and an underlying and adjoining diffusion region. The diffusion region is doped by a second conductivity type opposite to the first conductivity type.

If a further bipolar transistor whose conductivity type is opposite to the conductivity type of the bipolar transistor is produced for the integrated circuit configuration, then preferably parts of the bipolar transistor and parts of the further bipolar transistor are produced simultaneously in order to reduce the process complexity.

By way of example, during the masked etching of the first insulating layer for the purpose of uncovering the first contact of the collector, a further part of the first insulating layer is removed in the region of the further bipolar transistor. By virtue of the production of the layer made of polysilicon, the removed further part of the first insulating layer is replaced by at least one part of an emitter of the further bipolar transistor. The bipolar transistor is an npn bipolar transistor and the further bipolar transistor is a pnp bipolar transistor. As an alternative, the bipolar transistor is a pnp bipolar transistor and the further bipolar transistor is an npn bipolar transistor.

The base has a lower dopant concentration than the polysilicon layer.

Other features which are considered as characteristic for the invention are set forth in the appended claims.

Although the invention is illustrated and described herein as embodied in a method for fabricating a bipolar transistor and method for fabricating an integrated circuit configuration having such a bipolar transistor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 5 shows the cross-section of FIG. 4 after the second auxiliary layer and a part of the first insulating layer have been removed, and a base has been produced;

FIG. 6 shows the cross section of FIG. 5 after the first auxiliary layer and the protective layer have been removed and a third insulating layer, a third auxiliary layer and spacers have been produced;

The figures are not true to scale.

DESCRIPTION OF THE PREFERRED EMBODIMENTS

Figure 1:
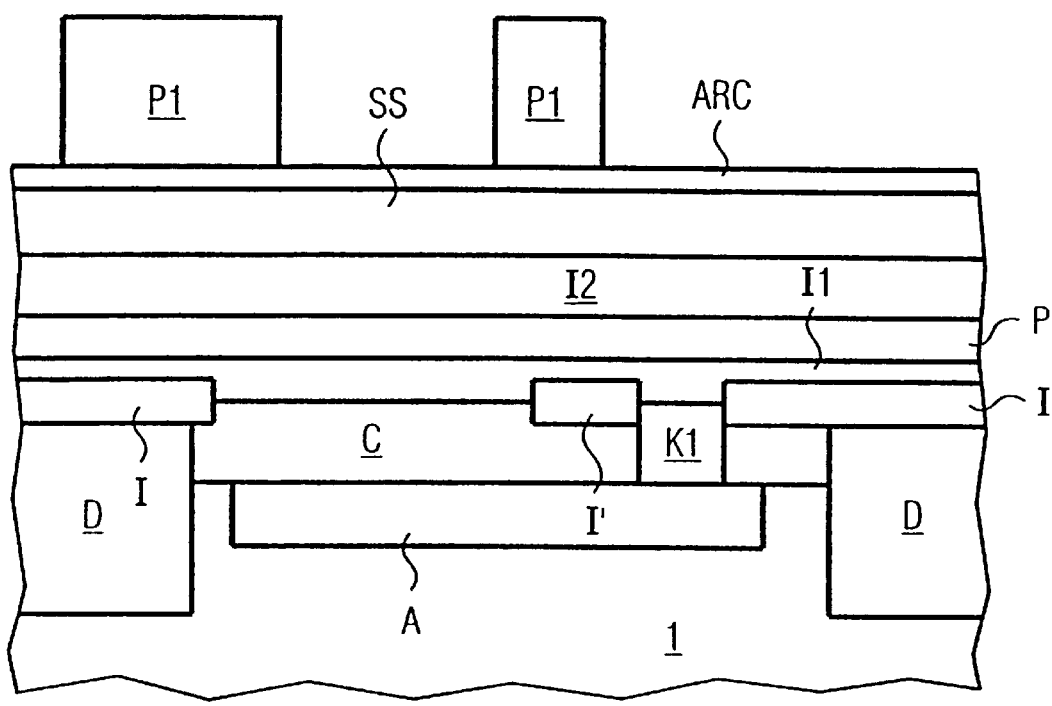
FIG. 1 is a cross section through a first substrate after the production of a connection region of a collector, a collector, a first contact of the collector, an insulation, a further insulation, a diffusion region, a first insulating layer, a layer made of polysilicon, a second insulating layer, a protective layer, a layer made of amorphous silicon, and a first mask made of photoresist.
Figure 2:
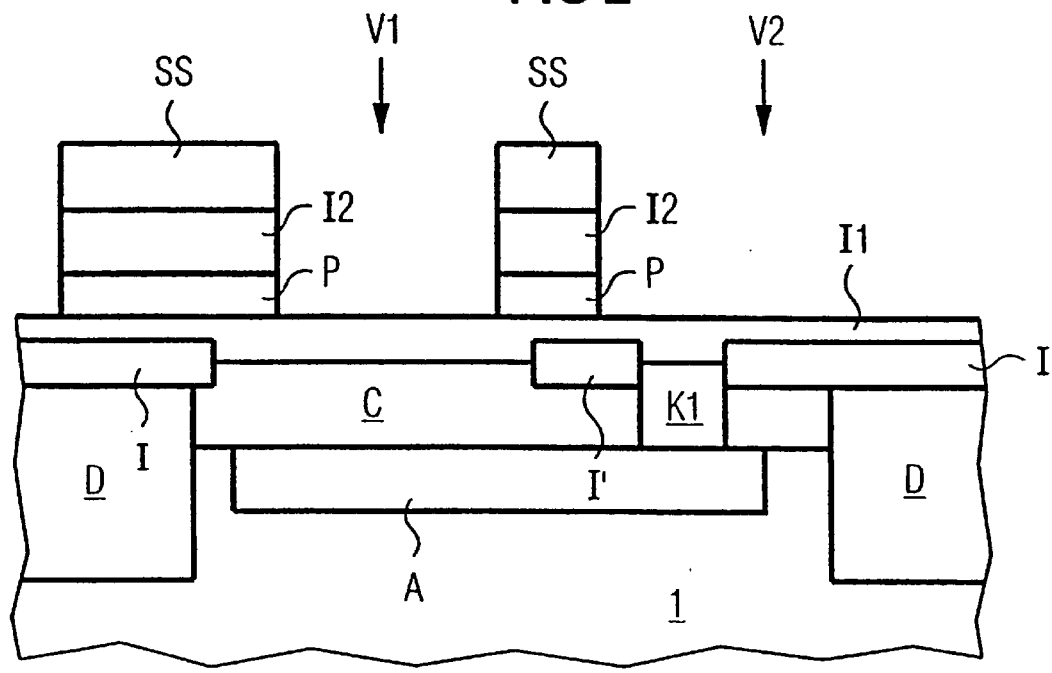
FIG. 2 shows the cross section of FIG. 1 after the production of a first depression and a first part of a second depression.

Referring now to the figures of the drawing in detail and first, particularly, to FIG. 1 thereof, in a first exemplary embodiment, the starting material is a first substrate 1 made of silicon which is p-doped with a dopant concentration of approximately $10^{15}$ cm$^{-3}$ in the region of a surface of the first substrate 1.

An n-doped connection region A of a collector C—the region has a thickness of approximately 1500 nm—adjoins a surface of the first substrate 1. The dopant concentration of the connection region A of the collector C is approximately $10^{20}$ cm$^{-3}$. An epitaxial layer which has a thickness of approximately 1500 nm and is arranged on the connection region A of the collector C forms the collector C (see FIG. 1). The dopant concentration of the collector C is approximately $10^{17}$ cm$^{-3}$.

An insulation I produced by thermal oxidation and a diffusion region D arranged underneath laterally surround the connection region A of the collector C. During the thermal oxidation, in addition to the insulation I, a further insulation I' is produced which is arranged above the connection region A of the collector C.

The diffusion region D is produced by implantation. The diffusion region D is p-doped and has a dopant concentration of approximately $10^{17}$ cm$^{-3}$.

Through masked implantation of a part of the connection region A of the collector C, a first contact K1 of the collector C is produced on the connection region A of the collector C (see FIG. 1). The first contact K1 of the collector C has a dopant concentration of approximately $10^{20}$ cm$^{-3}$ and is arranged between the further insulation I' and a part of the insulation I.

A first insulating layer I1 is produced by depositing $SiO_2$ to a thickness of approximately 100 nm (see FIG. 1).

A layer made of polysilicon P and having a thickness of approximately 200 nm is produced by depositing in situ p-doped polysilicon. The dopant concentration of the layer made of polysilicon P is approximately $10^{21}$ cm$^{-3}$.

A second insulating layer I2 is produced by depositing $SiO_2$ to a thickness of approximately 200 nm.

A protective layer SS is produced by depositing silicon nitride to a thickness of approximately 200 nm.

A layer made of amorphous silicon and silicon nitride ARC is produced by depositing amorphous silicon to a thickness of approximately 80 nm and silicon nitride to a thickness of approximately 40 nm (see FIG. 1).

In order to produce a first mask P1 made of photoresist, photoresist is applied to a thickness of approximately 800 nm, exposed and patterned. The layer made of amorphous silicon and silicon nitride ARC prevents scattered light from arising during the exposure process.

With the aid of the first mask P1 made of photoresist, a first depression V1 and a first part of a second depression V2 are produced, which reach as far as the first insulating layer I1.

To that end, etching is effected firstly as far as the layer made of polysilicon P, which acts as an etching stop. The first mask P1 is removed. Afterward, polysilicon is etched anisotropically selectively with respect to $SiO_2$ and silicon nitride, so that the layer made of polysilicon P is cut through and the first insulating layer I1 acts as an etching stop. The layer made of amorphous silicon and silicon nitride ARC is removed in the process.

The first depression V1 is arranged above the collector C. The first part of the second depression V2 is arranged beside the first depression V1 and above the first contact K1 of the collector C. The first depression V1 has a square horizontal cross section with a side length of approximately 400 nm.

The second depression V2 has a rectangular horizontal cross section whose side lengths are approximately 1300 nm and 400 nm. The first depression V1 and the second depression V2 are at a distance of approximately 1.4 $\mu$m from one another.

Figure 3:
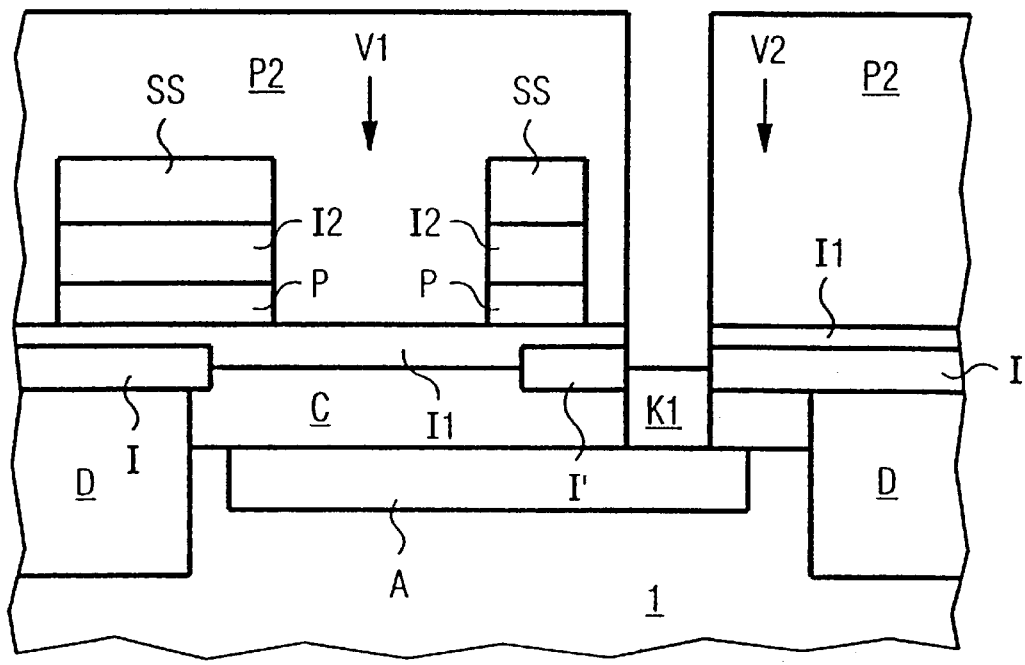
FIG. 3 shows the cross section of FIG. 2 after the production of a second mask made of photoresist and a second part of the second depression.

With the aid of a second mask P2 made of photoresist, a second part of the second depression V2 is produced, which reaches as far as the first contact K1 of the collector C (see FIG. 3). The second part of the second depression V2 is arranged between the further insulation I' and the insulation I.

The second photoresist mask P2 is removed.

Figure 4:
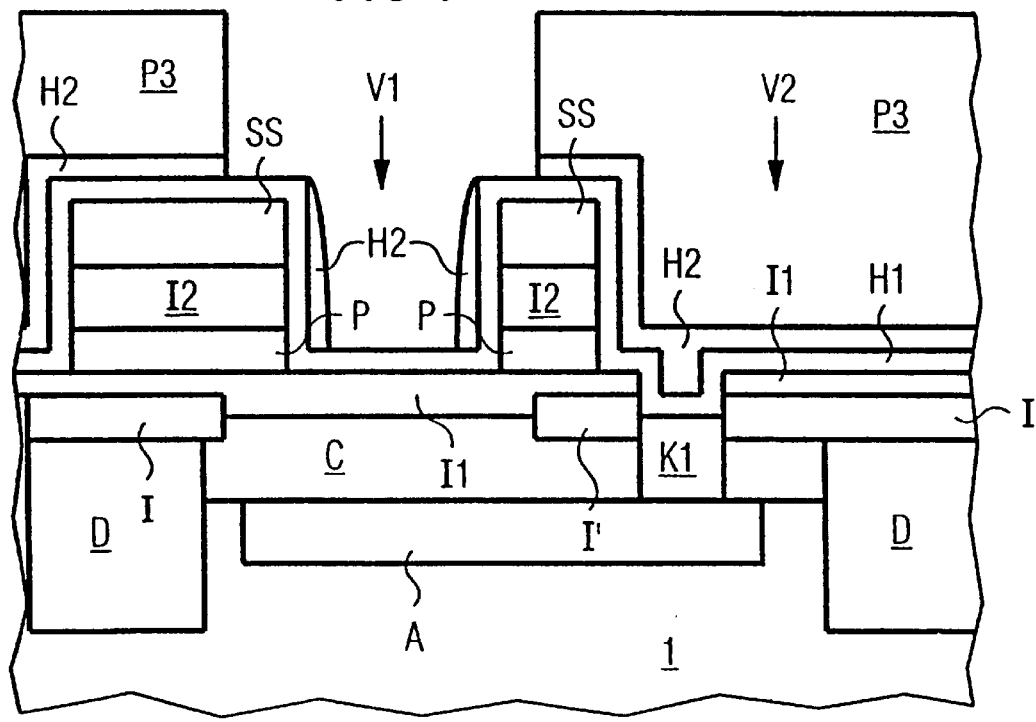
FIG. 4 shows the cross section of FIG. 3 after the production of a first auxiliary layer, a second auxiliary layer and a protective mask.

Afterwards, a first auxiliary layer H1 is produced by depositing silicon nitride to a thickness of approximately 30 nm (see FIG. 4). $SiO_2$ is deposited above that to a thickness of approximately 80 nm in order to produce a second auxiliary layer H2.

With the aid of a protective mask P3 made of photoresist, whose opening has a larger horizontal cross section than the first depression V1 and is arranged above the first depression V1, the second auxiliary layer H2 is etched anisotropically until the first auxiliary layer H1 is uncovered. In this case, the protective mask P3 covers the second depression V2 (see FIG. 4).

The protective mask P3 is subsequently removed. Uncovered parts of the first auxiliary layer H1 are removed by isotropic etching using phosphoric acid, for example, selectively with respect to the second auxiliary layer H2. The protective layer SS and the first insulating layer I1 are partly removed in the process (see FIG. 5).

By means of the isotropic etching of $SiO_2$ using $NH_3+HF$, for example, selectively with respect to silicon nitride and with respect to silicon, a part of the first insulating layer I1 which is arranged on the collector C and is arranged between the further insulation I' and the insulation I is removed, so that the layer made of polysilicon P is undercut and partly uncovered. In this case, the first auxiliary layer H1 and the protective layer SS protect the second insulating layer I2 and parts of the first insulating layer I1 which are arranged in the region of the second depression V2. The second auxiliary layer H2 is also removed during the isotropic etching process.

By means of in situ-doped selective epitaxy, the removed part of the first insulating layer I1 is replaced by a p-doped base B (see FIG. 5). The base B is composed substantially of monocrystalline silicon and is composed of polycrystalline silicon only in the vicinity of the layer made of polysilicon P. The dopant concentration of the base B is approximately $10^{19}$ cm$^{-3}$. The layer made of polysilicon P acts as a connection region of the base B.

The first auxiliary layer H1 and the protective layer SS are removed by etching using phosphoric acid, for example.

In order to produce a third insulating layer I3, $SiO_2$ is deposited to a thickness of approximately 40 nm. In order to produce a third auxiliary layer H3, silicon nitride is deposited to a thickness of approximately 25 nm. In order to produce spacers SP, polysilicon is deposited to a thickness of approximately 130 nm and etched back until the third auxiliary layer H3 is uncovered (see FIG. 6).

Figure 7:
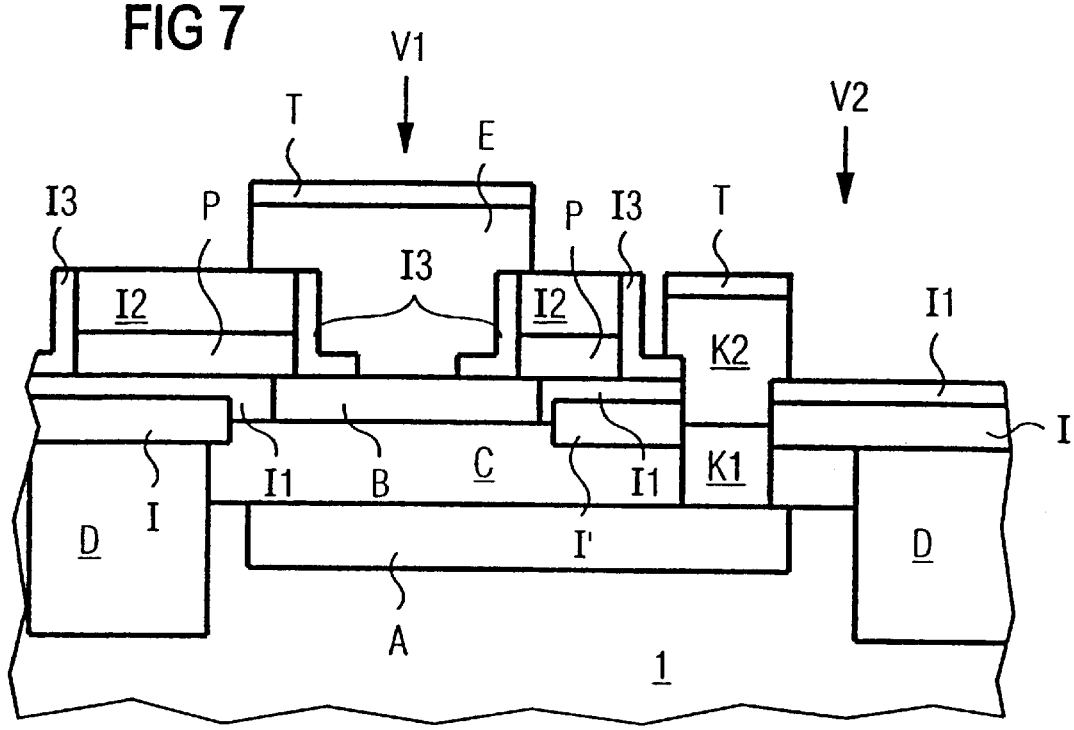
FIG. 7 shows the cross section of FIG. 6 after the spacers and the third auxiliary layer have been removed and an emitter, a second contact of the collector and an isolating layer have been produced.

The third auxiliary layer H3 and the third insulating layer I3 are etched isotropically selectively with respect to polysilicon until the base B is partly uncovered (see FIG. 7). Afterward, the spacers SP and the third auxiliary layer H3 are removed by isotropic etching.

Afterward, polysilicon doped by the first conductivity type and, above that, an isolating layer T made of silicon nitride and having a thickness of approximately 30 nm are deposited and jointly patterned by masked anisotropic etching to produce an emitter E which is covered by the isolating layer T, is partly arranged in the first depression V1, adjoins the third insulating layer I3 and the base B and partly overlaps the second insulating layer I2, and a second contact K2 of the collector C is produced which is covered by the isolating layer T, is partly arranged in the second part of the second depression V2, adjoins the first contact K1 of the collector C and partly overlaps the first insulating layer I1 (see FIG. 7). The third insulating layer I3 isolates the emitter E from the layer made of polysilicon P.

By means of the anisotropic etching of $SiO_2$ selectively with respect to silicon nitride, the first insulating layer I1 is etched until the layer made of polysilicon P is uncovered. In this case, the further insulation I' and a part of the insulation I are uncovered in the region of the second depression V2 (see FIG. 8).

Figure 8:
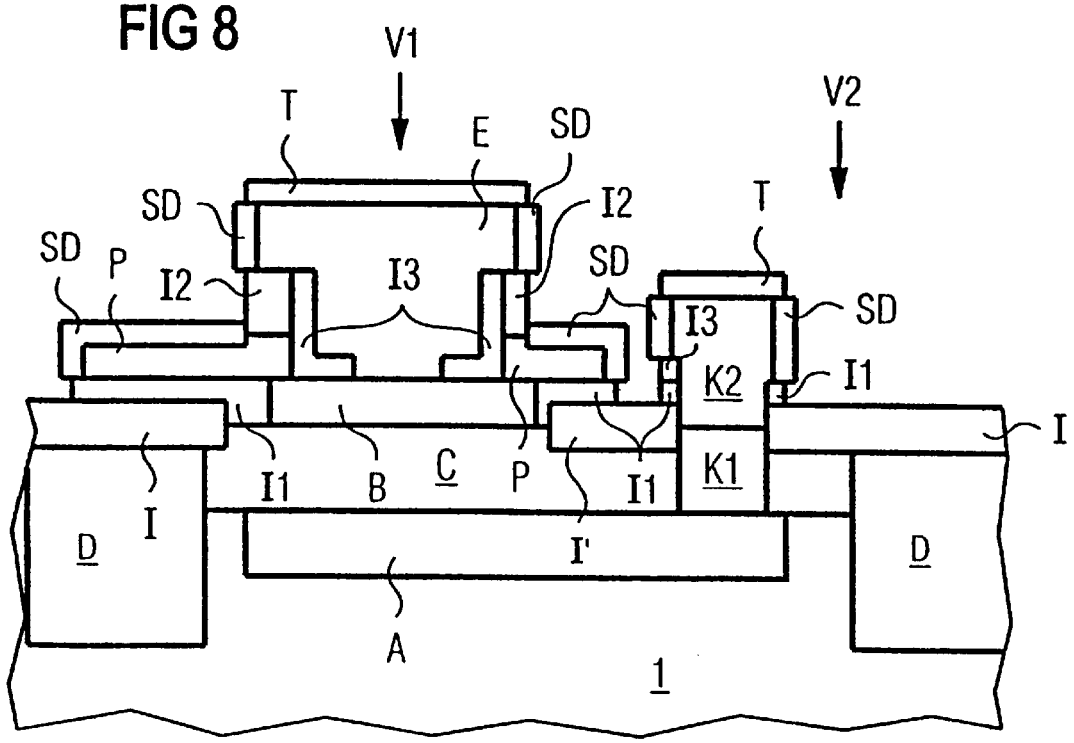
FIG. 8 shows the cross section of FIG. 7 after the production of a silicide layer.

A siliconization is subsequently carried out, so that a silicide layer SD is produced on the layer made of polysilicon P and at lateral areas of the emitter E and of the second contact K2 of the collector C (see FIG. 8).

Figure 9:
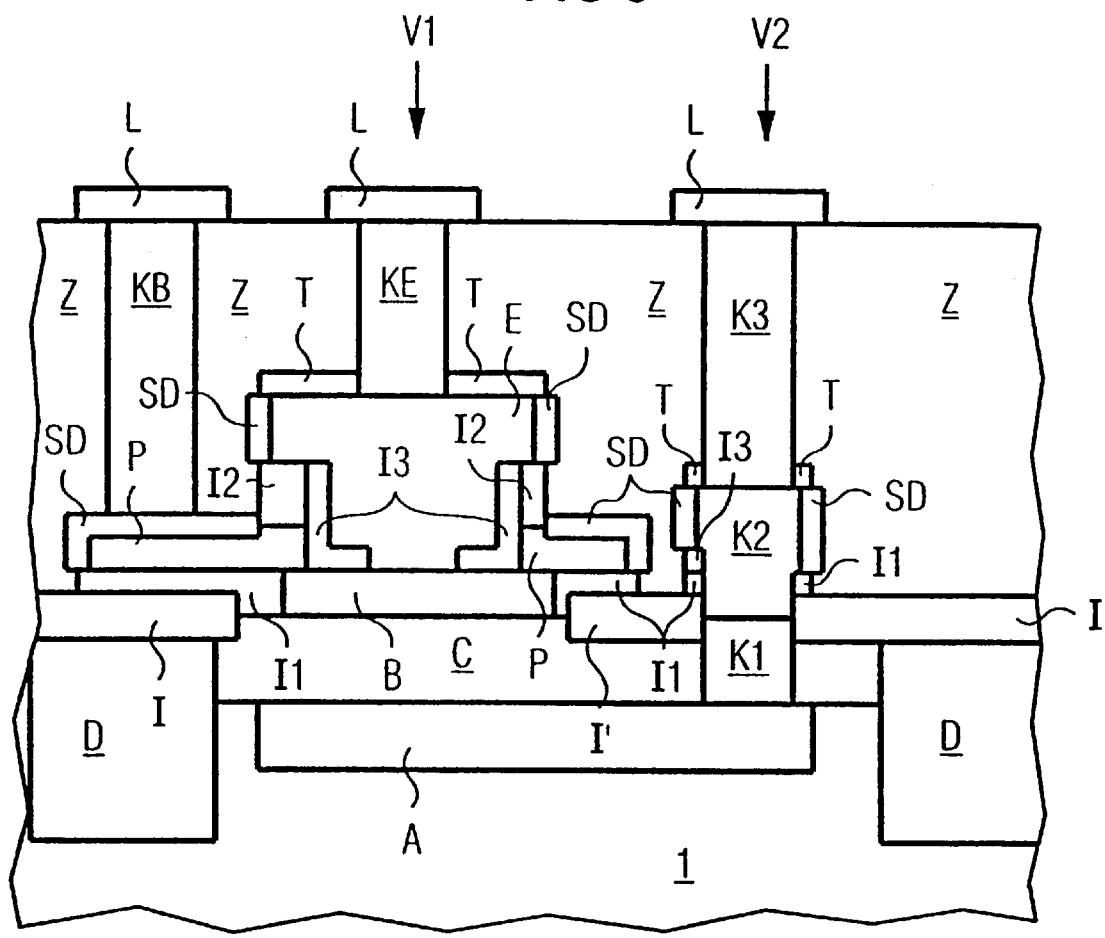
FIG. 9 shows the cross section of FIG. 8 after the production of an intermediate oxide, a contact of the base, a contact of the emitter, a third contact of the collector and lines.

Afterward, $SiO_2$ is deposited and planarized by chemical mechanical polishing, thereby producing an intermediate oxide z having a thickness of approximately 1500 nm (see FIG. 9).

Masked etching is effected to produce a first contact hole, which reaches as far as the silicide layer SD arranged on the layer made of polysilicon P, a second contact hole, which reaches as far as the emitter E, and a third contact hole, which reaches as far-as the second contact K2 of the collector C. The isolating layer T is also cut through in the process.

By means of the deposition of tungsten and chemical mechanical polishing until the intermediate oxide Z is uncovered, a contact KB of the base is produced in the first contact hole, a contact KE of the emitter is produced in the second contact hole and a third contact K3 of the collector is produced in the third contact hole.

Lines L are produced by the deposition of AlCu to a thickness of approximately 400 nm and masked etching. One of the lines L is arranged on the contact KB of the base B. Another of the lines L is arranged on the contact KE of the emitter E. Another of the lines L is arranged on the third contact K3 of the collector C (see FIG. 9).

The method described produces a bipolar transistor whose base resistance, on account of the silicide layer SD, is smaller than its external emitter resistance and than its external collector resistance.

In a second exemplary embodiment, the starting material provided is a second substrate 2 made of silicon.

The second substrate 2 is p-doped with a dopant concentration of approximately $10^{15}$ cm$^{-3}$ in the region of a surf-ace of the second substrate 2.

An n-doped well W having a dopant concentration of approximately $10^{17}$ cm$^{-3}$ is produced by masked implantation with phosphorus.

Masked implantation is effected to produce, in the second substrate 2, an n-doped connection region AN of a collector CN of a bipolar transistor, which is arranged approximately 1800 nm beside the well W, is approximately 1500 nm thick and has a dopant concentration of approximately $10^{20}$ cm$^{-3}$. At the same time, a first part of a connection region X of the well W is produced, which is arranged in an edge region of the well W (see FIG. 10).

Whole-area in situ n-doped epitaxy is effected to produce a layer which has a thickness of approximately 1500 nm and forms the collector CN of the bipolar transistor above the connection region AN of the collector CN of the bipolar transistor.

A second masked implantation is effected to produce above the well W in the epitaxially grown layer a buried p-doped connection region AP of a collector CP of a further bipolar transistor, which is p-doped, is arranged approximately 650 nm below the surface of the epitaxially grown layer and has a dopant concentration of approximately $10^{18}$ cm$^{-3}$.

Figure 10:
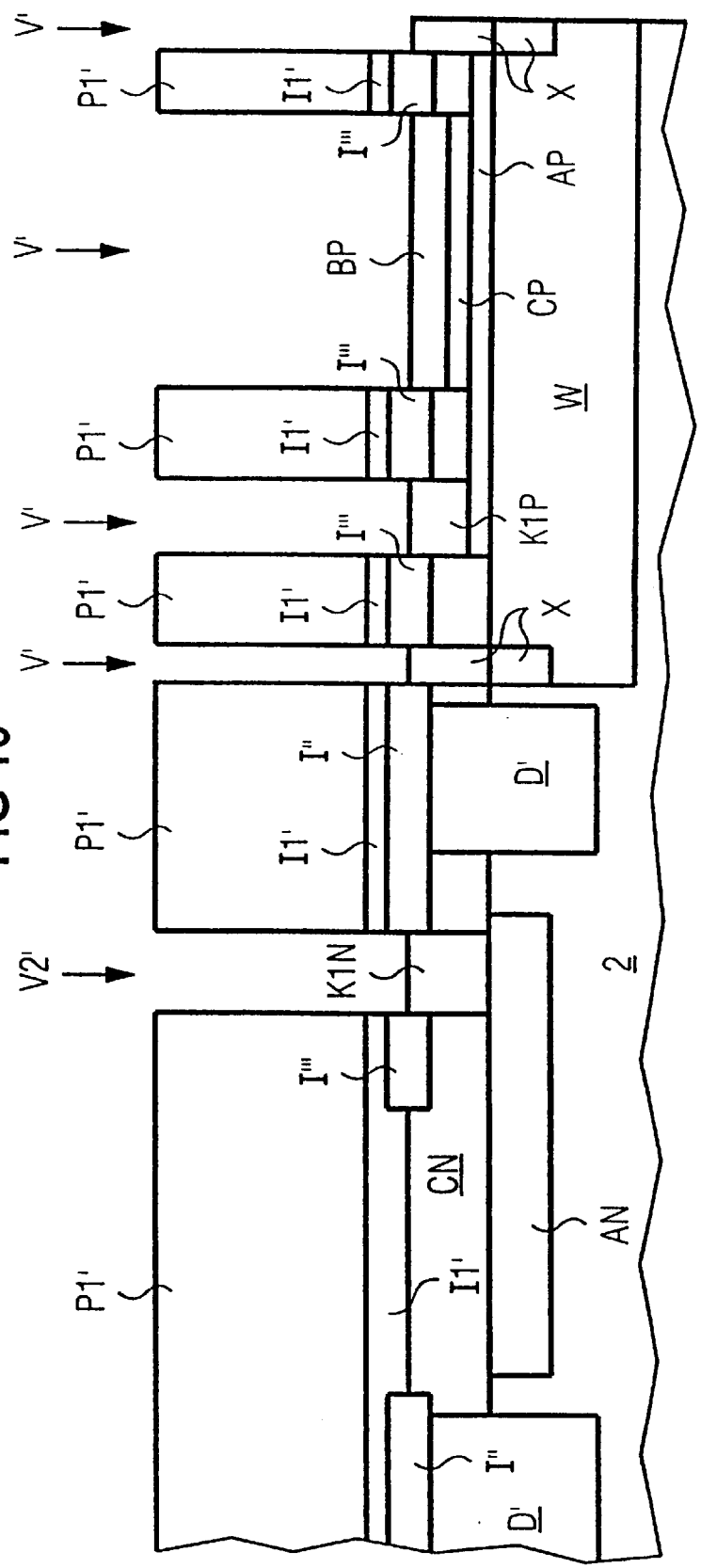
FIG. 10 shows a cross section through a second substrate after the production of connection regions of collectors, collectors, a first contact to one of the collectors, a base, a well, a connection region to the well, an insulation, a further insulation, diffusion regions, a first insulating layer, a first mask, a second part of a second depression and further depressions.

As in the first exemplary embodiment, an insulation I", a further insulation I''', a diffusion region D' and a first contact K1N of the collector CN of the bipolar transistor are produced (see FIG. 10). During the production of the first contact K1N of the collector CN of the bipolar transistor, a second part of the connection region X of the well W is produced on the first part of the connection region X of the well W. Furthermore, a p-doped contact K1P of the collector CP, which has a dopant concentration of approximately $10^{17}$ cm$^{-3}$, is produced by implantation above a part of the connection region AP of the collector CP of the further bipolar transistor.

The collector CP of the further bipolar transistor, which is arranged approximately 150 nm below the surface of the epitaxially grown layer, is produced by implantation above the connection region AP of the collector CP of the further bipolar transistor. The dopant concentration of the p-doped collector CP of the further bipolar transistor is approximately $3*10^{16}$ cm$^{-3}$.

A part of the epitaxially grown layer which is arranged on the collector CP of the further bipolar transistor is additionally n-doped such that it has a dopant concentration of approximately $5*10^{18}$ cm$^{-3}$, and forms a base BP of the further bipolar transistor.

A first insulating layer I1' is produced by depositing $SiO_2$ to a thickness of approximately 100 nm.

With the aid of a first mask P1' made of photoresist, a second part of a second depression V2' is produced in the first insulating layer I1', said second part reaching as far as the first contact K1N of the collector CN of the bipolar transistor. Furthermore, further depressions V' are produced which uncover the contact K1P of the collector CP of the further bipolar transistor, the connection regions X of the well W and the base BP of the further bipolar transistor (see FIG. 10).

Then the first mask P1' is removed.

Figure 11:
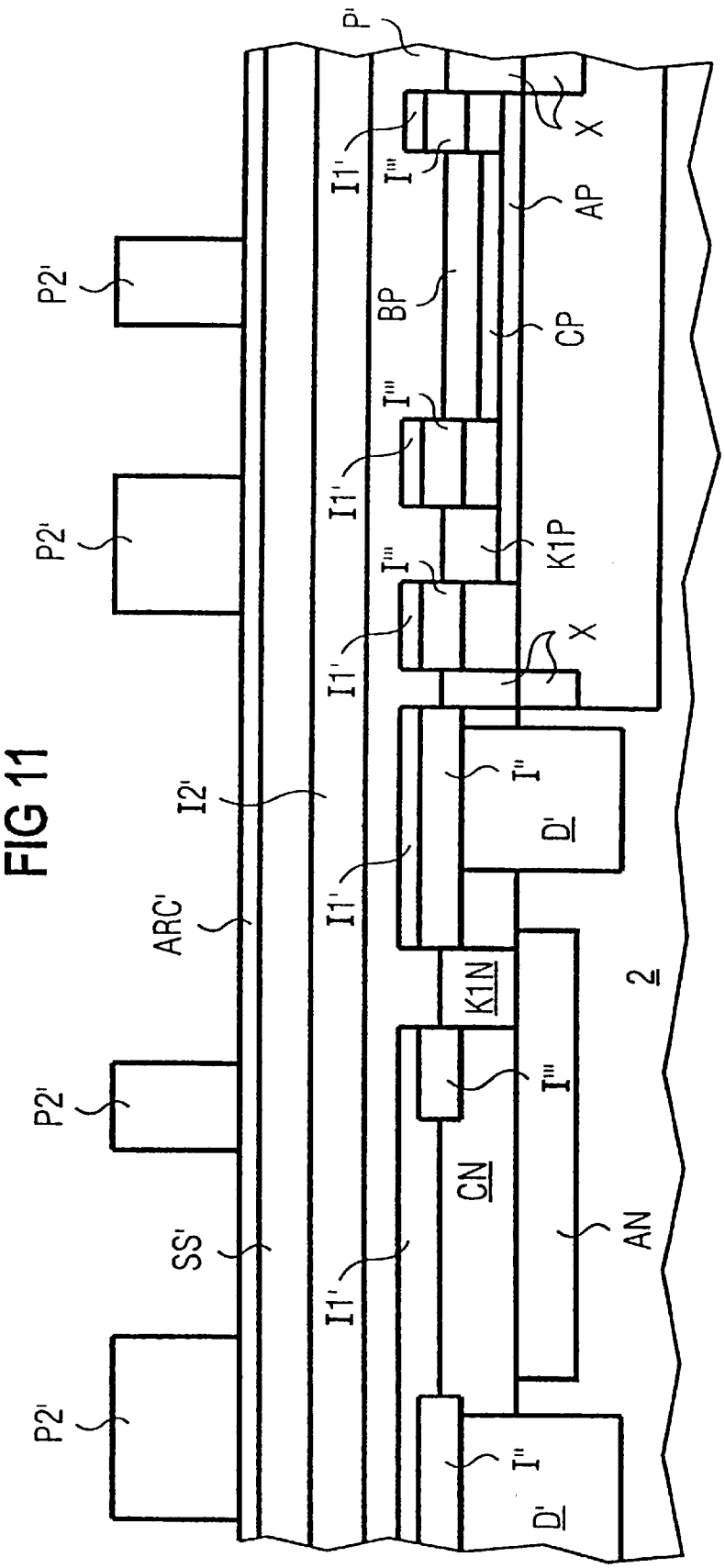
FIG. 11 shows the cross section of FIG. 10 after the production of a layer made of polysilicon, a second insulating layer, a protective layer, a layer made of amorphous silicon and a second mask.

Afterward, as in the first exemplary embodiment, there are produced (see FIG. 11) a layer made of polysilicon P', a second insulating layer I2', a protective layer SS', a layer made of amorphous silicon and silicon nitride ARC' and a second mask P2' made of photoresist, which corresponds to the first mask P1 made of photoresist of the first exemplary embodiment. The second mask also covers a region above the base BP of the further bipolar transistor and the contact K1P of the collector CP of the further bipolar transistor.

Figure 12:
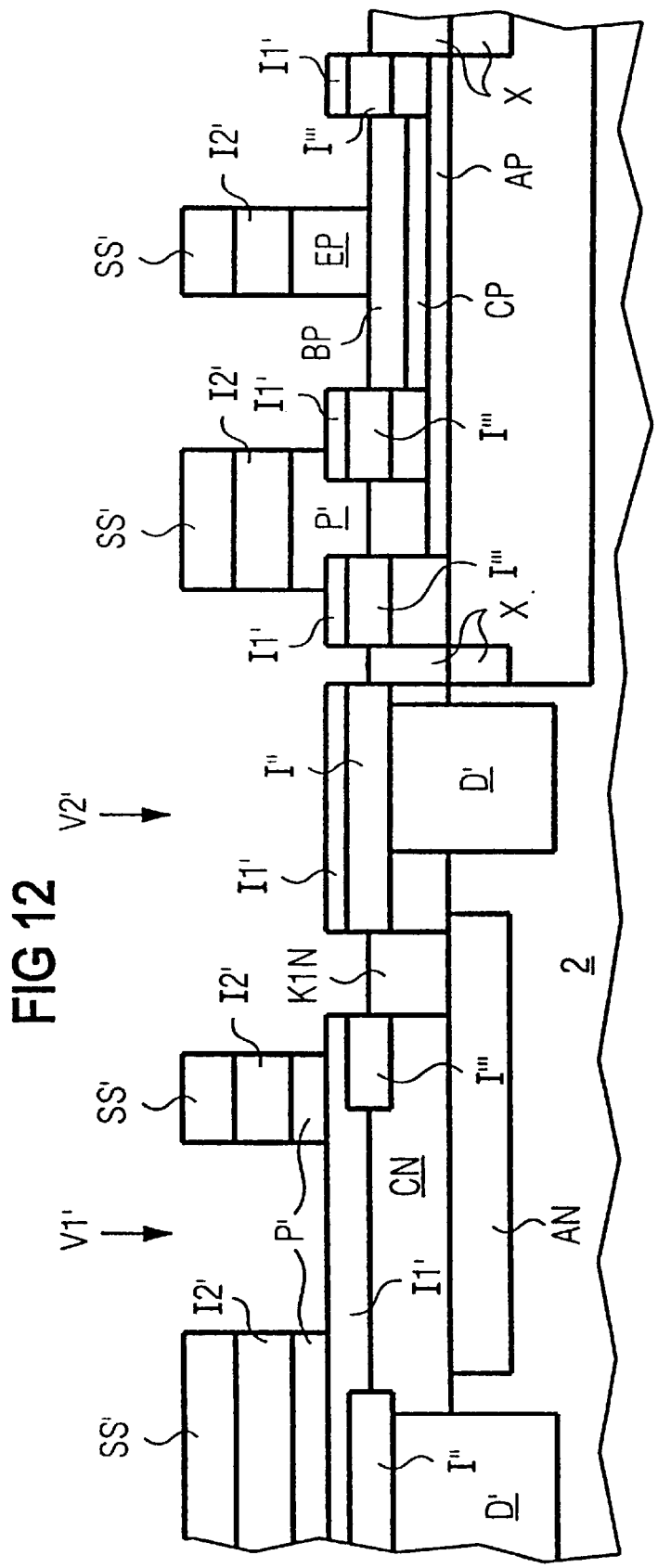
FIG. 12 shows the cross section of FIG. 11 after the production of a first depression and a first part of the second depression.

As in the first exemplary embodiment, a first depression V1' and the second depression V2' are produced with the aid of the second mask P2', the first contact K1P of the collector CN of the bipolar transistor, a part of the base BP of the further bipolar transistor and the connection region X of the well W being uncovered. A part of the layer made of polysilicon P' which is arranged in the first insulating layer I1' and on the base BP of the further bipolar transistor forms an emitter EP of the further bipolar transistor (see FIG. 12).

The bipolar transistor is subsequently completed as in the first exemplary embodiment. In this case, the third photoresist mask covers the further bipolar transistor during the patterning of the first auxiliary layer.

This method is used to fabricate an integrated circuit configuration which comprises the bipolar transistor and the further bipolar transistor, the bipolar transistor being an npn bipolar transistor and the further bipolar transistor being a pnp bipolar transistor.

There are many conceivable variations of the exemplary embodiment which likewise lie within the scope of the invention. Thus, dimensions of the described layers, masks, insulations and regions can be adapted to the respective requirements.

We claim:

1. A method of fabricating a bipolar transistor, which comprises:

producing a collector doped by a first conductivity type in a substrate of semiconductor material;

producing a first insulating layer covering the collector on the substrate;

producing a polysilicon layer doped by a second conductivity type, opposite the first conductivity type, on the first insulating layer;

producing a second insulating layer on the polysilicon layer;

forming a first depression above the collector, cutting through the second insulating layer and the polysilicon layer;

subsequently producing a first auxiliary layer and a second auxiliary layer above the first auxiliary layer, and forming the first and second auxiliary layers so thin as not to fill the first depression;

anisotropically etching the second auxiliary layer until the first auxiliary layer is uncovered;

isotropically etching the first auxiliary layer selectively with respect to the second auxiliary layer until a part of the first insulating layer is uncovered;

removing a part of the first insulating layer by isotropic etching selectively with respect to the first auxiliary layer, thereby uncovering parts of the polysilicon layer and parts of the collector;

replacing the removed part of the first insulating layer with a base by selective epitaxy of silicon in situ-doped by the second conductivity type;

subsequent to producing the base, producing a third auxiliary layer;

producing spacers in the first depression on the third auxiliary layer, by deposition and etching-back of material;

isotropically etching the third auxiliary layer selectively with respect to the spacers, and uncovering the base;

depositing polysilicon doped by the first conductivity type and, thereabove, an isolating layer, and jointly patterning to produce an emitter covered by the isolating layer, partly arranged in the first depression, adjoining the base, and partly overlapping the second insulating layer;

anisotropically etching the second insulating layer selectively with respect to the isolating layer until the polysilicon layer is uncovered;

producing a silicide layer on the polysilicon layer but not on the isolating layer;

producing a base contact on the silicide layer; and subsequent to producing the silicide layer, at least partly removing the isolating layer, and producing an emitter contact on the emitter.

2. The method according to claim 1, which comprises:

prior to producing the first insulating layer, forming a connection region of the collector in the form of a buried layer doped by the first conductivity type, arranged below the collector and having a higher dopant concentration than the collector;

prior to producing the first insulating layer, producing in the substrate a first collector contact reaching as far as the connection region of the collector;

producing the first insulating layer to cover the first collector contact;

subsequent to producing the second insulating layer and prior to producing the first auxiliary layer, forming a second depression, which, in the region of the first contact of the collector, reaches as far as the first collector contact and, outside the region of the first collector contact, reaches as far as the first insulating layer and is arranged beside the first depression;

covering the second depression with a protective mask during the step of anisotropically etching of the second auxiliary layer;

during the step of producing the emitter, patterning the polysilicon and the isolating layer to produce a second collector contact covered by the isolating layer, arranged in the second depression and on the first contact of the collector, and partly overlapping the first insulating layer; and subsequent to producing the silicide layer, at least partly removing the isolating layer on the second collector contact, and producing a third collector contact on the second collector contact.

3. The method according to claim 2, which comprises:

producing an intermediate oxide after producing the silicide layer;

forming in the intermediate oxide a first contact hole, reaching as far as the silicide layer, a second contact hole, reaching as far as the emitter, and a third contact hole, reaching as far as the second collector contact;

producing the base contact in the first contact hole;

producing the emitter contact in the second contact hole; and producing the third collector contact in the third contact hole.

4. The method according to claim 2, which comprises:

subsequent to producing the first insulating layer, uncovering the first contact of the collector by masked etching; and subsequently producing the polysilicon layer to adjoin the first collector contact.

5. A method of fabricating an integrated circuit configuration, which comprises:

producing at least one bipolar transistor with the method according to claim 4;

removing a further part of the first insulating layer during the masked etching of the first insulating layer for the purpose of uncovering the first collector contact;

by producing the polysilicon layer, replacing the removed further part of the first insulating layer by at least one part of an emitter of a further bipolar transistor whose conductivity type is opposite to the conductivity type of the bipolar transistor.

6. The method according to claim 1, which comprises:

producing the first insulating layer, the second insulating layer, and the second auxiliary layer from $SiO_2$;

producing the first auxiliary layer from silicon nitride;

producing a protective layer made of silicon nitride on the second insulating layer;

producing the first depression and the second depression after producing the protective layer; and removing the protective layer during the step of removing the first auxiliary layer.

7. The method according to claim 1, which comprises:

subsequent to producing the base and prior to producing the third auxiliary layer, producing a third insulating layer from $SiO_2$, so thin as not to fill the first depression with the third insulating layer and the third auxiliary layer;

producing the third auxiliary layer from silicon nitride;

producing the spacers from polysilicon;

isotropically etching the third auxiliary layer selectively with respect to the spacers until the third insulating layer is uncovered; and subsequent to the isotropic etching of the third auxiliary layer, isotropically etching the third insulating layer selectively with respect to the third auxiliary layer until the base is uncovered.

8. The method according to claim 1, wherein the substrate is composed of silicon.

9. The method according to claim 1, which comprises:

prior to producing a first mask used to produce the first depression, depositing a layer made of amorphous silicon; and removing the layer made of amorphous silicon during the etching of the polysilicon layer for producing the first depression.

10. The method according to claim 1, which comprises, prior to producing the first insulating layer, forming an insulating structure in the substrate, the insulating structure laterally surrounding that part of a bipolar transistor to be produced that is arranged in the substrate.

* * * * *